United States Patent
Lin et al.

(10) Patent No.: US 6,664,189 B1
(45) Date of Patent: Dec. 16, 2003

(54) REMOVAL OF WAFER EDGE DEFOCUS DUE TO CMP

(75) Inventors: Kuang-Hung Lin, Hsinchu (TW); Feng-Inn Wu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 62 days.

(21) Appl. No.: 10/140,659

(22) Filed: May 8, 2002

(51) Int. Cl.⁷ ............................................. H01L 21/302
(52) U.S. Cl. ..................... 438/692; 438/693; 438/694; 216/88; 216/89; 451/57
(58) Field of Search .............................. 438/692, 693, 438/694; 216/88, 89; 451/57

(56) References Cited

U.S. PATENT DOCUMENTS

| | | | |
|---|---|---|---|
| 5,899,745 A | 5/1999 | Kim et al. ................ | 438/692 |
| 6,051,499 A | 4/2000 | Tolles et al. ............. | 438/692 |
| 6,165,904 A * | 12/2000 | Kim .......................... | 438/692 |
| 6,171,513 B1 | 1/2001 | Davis et al. .............. | 216/88 |
| 6,171,962 B1 * | 1/2001 | Karlsson et al. ......... | 438/692 |
| 6,271,138 B1 | 8/2001 | Chang et al. ............ | 438/691 |
| 6,486,049 B2 * | 11/2002 | Maltabes et al. ........ | 438/597 |

* cited by examiner

Primary Examiner—George Goudreau
(74) Attorney, Agent, or Firm—George O. Saile; Stephen G. Ackerman

(57) ABSTRACT

At the conclusion of chemical mechanical polishing (CMP) there is found to be a topography difference at the periphery of the wafer. For example, for a 200 mm wafer, the oxide surface in a peripheral region up to 20 mm wide, may end up about 1,000 Å above or below the central portion of the surface. This problem has been overcome by varying the type of polishing pad and retainer ring from one CMP operation to the next. Thus, if the equipment that is used to effect a given CMP step results in a post CMP surface in which the periphery of the wafer is higher than the center, CMP equipment for the next layer is selected that, operating alone, would result in a surface in which the periphery of the wafer is lower than the center. The two CMP operations thus cancel each other and a uniformly flat final surface results. The conditions required to produce either surface topography are described and discussed.

34 Claims, 3 Drawing Sheets

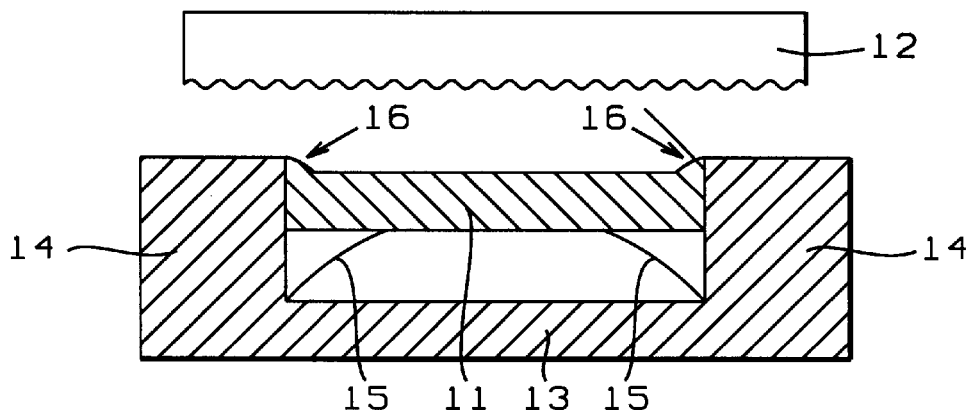
FIG. 1 – Prior Art
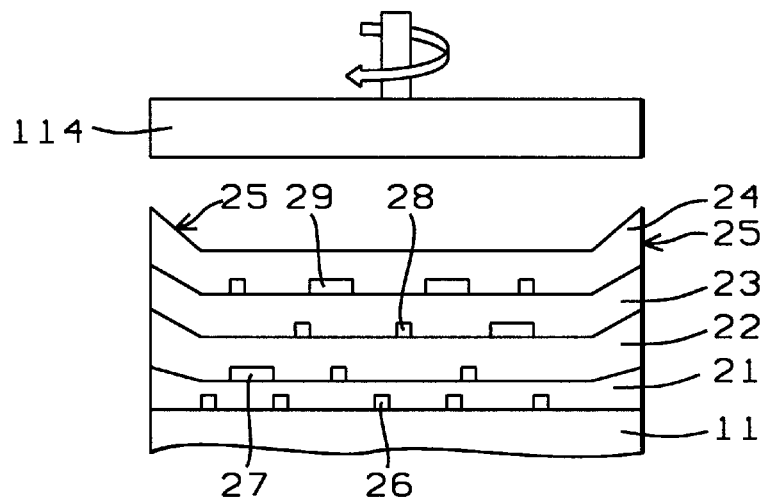
FIG. 2 – Prior Art
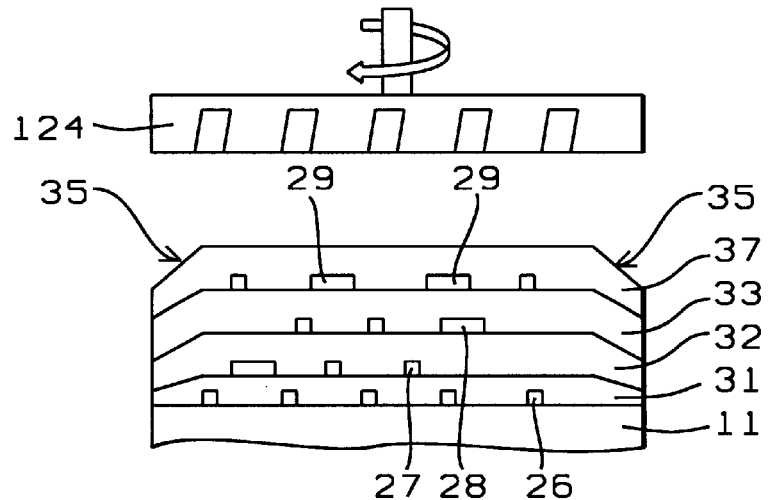
FIG. 3 – Prior Art

REMOVAL OF WAFER EDGE DEFOCUS DUE TO CMP

FIELD OF THE INVENTION

The invention relates to the general field of CMP (chemical mechanical polishing) with particular reference to elimination of differential polishing effects at the periphery of a wafer.

BACKGROUND OF THE INVENTION

CMP (chemical mechanical polishing) has been a basic approach in planarization of sub-micron technology integrated circuits. A layer, such as an oxide layer, can be deposited over a pre-patterned conductive layer and can then be polished to a high degree of flatness which is important when dealing with very limited depths of focus during subsequent photolithographic processes.

The principal parts of a CMP apparatus are schematically illustrated in FIG. 1. Wafer 11 is mounted inside chuck 13 which includes a retaining ring 14. Polishing pad 12 is brought to bear against the upper surface of wafer 11 and the latter is kept pressed against it by means of elastic membrane 15. There is, however, always present a topography difference at the periphery of the wafer. This is exemplified by the raised areas 16 seen in the figure. For example, for a 200 mm wafer, the oxide surface in a peripheral region up to 20 mm wide, may end up about 1,000 Å above or below the central portion of the surface.

These topography differences that arise out of CMP are bad enough on an individual basis but they become particularly serious when they accumulate as a result of the deposition of multiple layers, each of which is planarized prior the deposition of the next layer. This has been illustrated in FIG. 2 which is for the case of a peripheral region 25 that ends up higher than the central region. Wafer 11 has been coated with 4 successive layers, 21, 22, 23, and 24 which cover patterned metal or polysilicon layers 26, 27, 28, and 29. Unlike FIG. 1, where polishing pad and retaining ring are shown as separate entities, both pad and retaining ring are shown here as a single entity 114 to simplify the presentation.

An example of a CMP apparatus in which the peripheral region 35 ends up lower than the central region is shown in FIG. 3. The principal difference between FIGS. 2 and 3 is that in the latter case the retaining ring included in 124 is of the slotted variety in which slots (symbolized as 36) are formed in said ring so as to allow for the easier removal of slurry during polishing. In this case, the peripheral effect is seen to grow steadily worse as successive layers 31, 32, 33, and 34 are laid down and then planarized.

In practice, whether the peripheral region ends up above or below the central region depends on a number of variables that are operative during CMP. This will be discussed in greater detail below as it is an understanding of these factors that have led to the solution of the peripheral height difference problem that comprises the present invention.

A routine search of the prior art was performed with the following references of interest being found:

In U.S. Pat. No. 6,051,499, Tolles et al. show a CMP tool and process with slotted carrier heads. Chang et al. disclose a planarization process in U.S. Pat No. 6,271,138 B1. U.S. Pat No. 5,899,745 (Kim et al.), and U.S. Pat No. 6,171,513 B1 (Davis et al.) are related CMP planarization processes.

SUMMARY OF THE INVENTION

It has been an object of at least one embodiment of the present invention to provide a process for planarizing a plurality of layers by means of CMP Another object of at least one embodiment of the present invention has been that the last of said layers that are planarized emerge with a uniformly flat surface having little or no thickness differences between the periphery and the center.

Still another object of at least one embodiment of the present invention has been that said process utilize existing CMP equipment and be fully compatible with CMP processes currently in use as part of conventional manufacturing procedures.

These objects have been achieved by varying the type of polishing pad and retainer ring from one CMP operation to the next. Thus, if the equipment that is used to effect a given CMP step results in a post CMP surface in which the periphery of the wafer is higher that the center, CMP equipment for the next layer is selected that, operating alone, would result in a surface in which the periphery of the wafer is lower than the center, so the two CMP operations cancel each other and a uniformly flat final surface results. The conditions required to produce either surface topography are described and discussed.

BRIEF DESCRIPTION OF THE DRAWINGS

FIG. 1 is a schematic representation of a standard CMP apparatus.

FIGS. 2 and 3 show how peripheral effects accumulate when successive layers are planarized and the same CMP equipment is used each time.

DESCRIPTION OF THE PREFERRED EMBODIMENTS

As already noted in the background section, whether the peripheral region of a wafer, after CMP, ends up higher or lower than the central region depends on a number of factors, the most important of which are the hardness/softness of the polishing pad and whether or not the retaining ring is slotted. The effects of hardness/softness and slotted/standard retaining rings is summarized in table I below. We note that in this context an example of a hard polishing pad is Rodel, IC1010 and an example of a soft pad is Rodel IC1000.

TABLE I

| Pad type → <br> Retaining ring type ↓ | HARD | SOFT |
| --- | --- | --- |
| STANDARD | 2–2.5 kÅ down | 1–1.5 kÅ up |
| SLOTTED | 2–3 kÅ up | 2–2.5 kÅ down |

Peripheral height relative to central region height after CMP of a layer 0.5–2.5 μm thick The process of the present invention makes use of the fact that two of the entries in TABLE I show higher peripheries and two show lower peripheries. Thus, by alternating the combination of pad and retainer ring types used for CMP, one resulting in a higher periphery and one resulting in a lower one, we can cancel out the effects of CMP for these two layers, there being no effective limit to how many such opposing layer pairs may be used.

Figure 4:
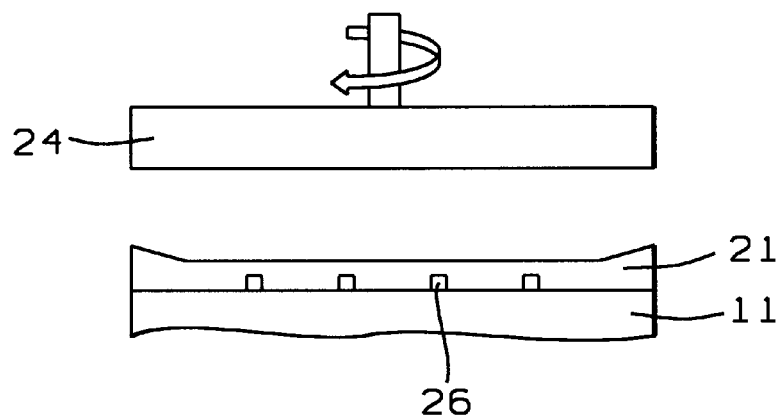
FIGS. 4–7 illustrate the process of the present invention wherein alternating layers are planarized using different CMP equipment for each.
Figure 5:
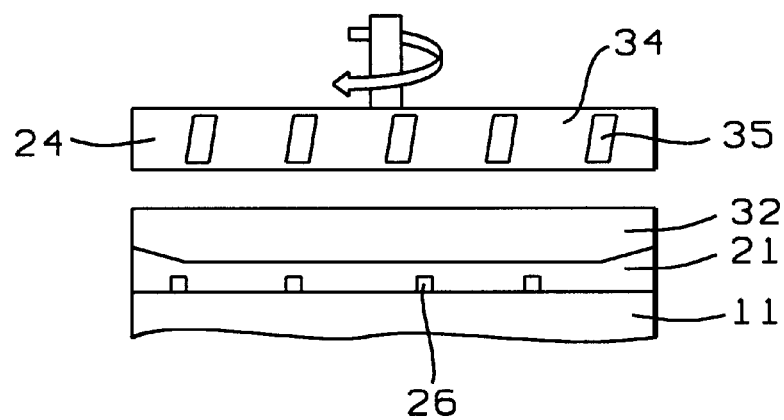

To illustrate this, we refer now to FIG. 4 in which the process happens to begin with planarizing layer 21, the CMP apparatus comprising a standard retainer ring and a soft pad. As seen in TABLE I, this combination of pad and ring results in a periphery that is higher than the central region. Accordingly, planarization of the next layer (32 in FIG. 5) is achieved by using the same soft pad but switching to a slotted retainer ring. Since this combination leads to a raised periphery, the effects of the previous planarization are canceled out and a uniform top surface 55 is obtained.

Figure 6:
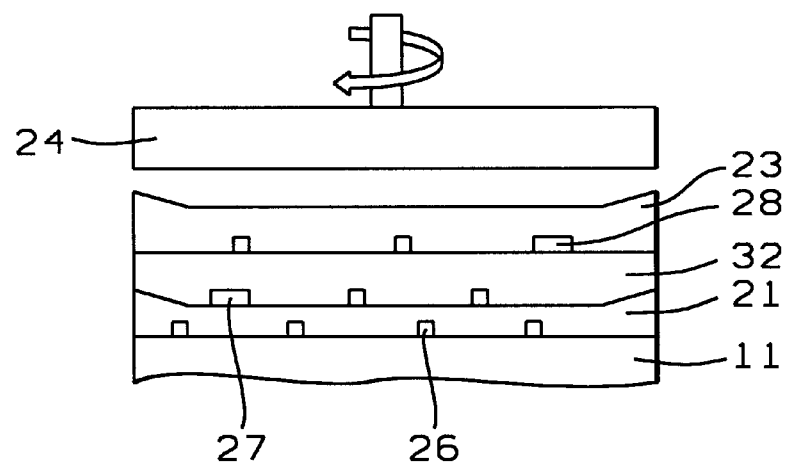
Figure 7:
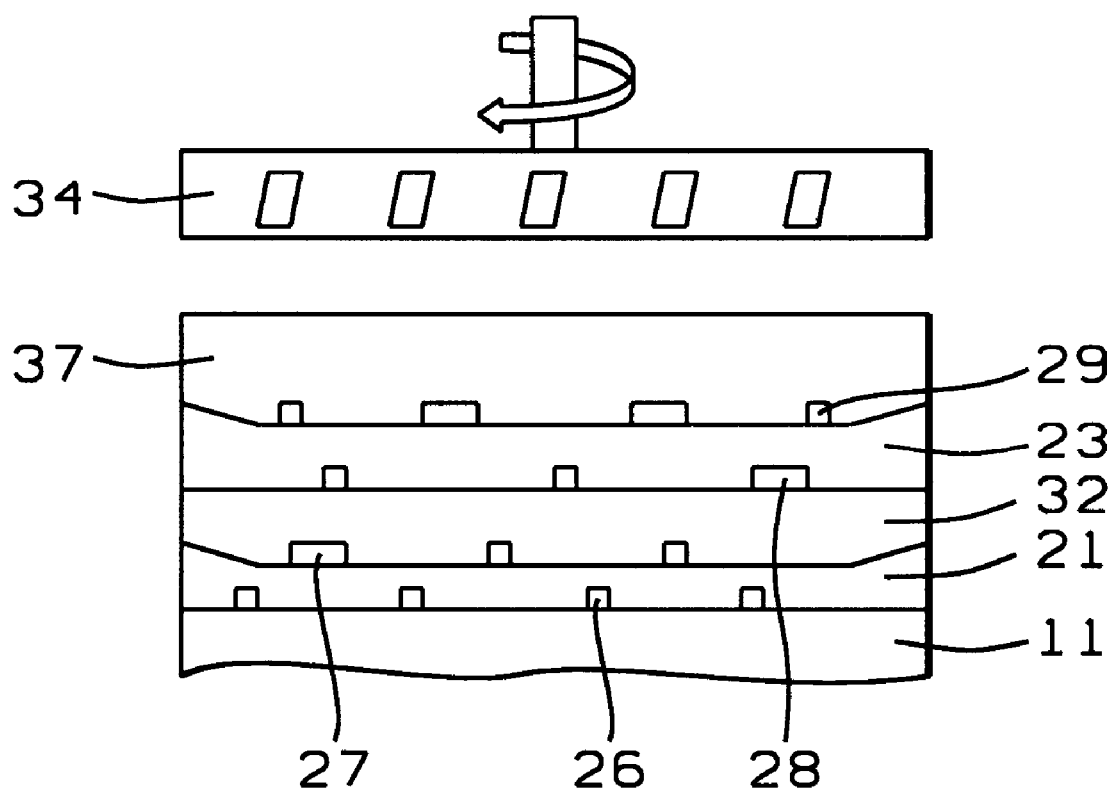

FIGS. 6 and 7 show how similar treatment of a third layer 23 and a fourth layer 37 result once more in a planar top surface.

We note here that in the event an odd umber of layers is required to be subjected to CMP, a uniformly flat final surface can still be obtained by dividing CMP of this final layer into two approximately equal steps in which half the layer is removed using CMP apparatus that results in a higher or lower periphery and half is removed in CMP apparatus that results in a lower or higher periphery, respectively.

We also note that our preferred process for changing CMP peripheral effects is to use the same pad for both operations, bringing about the needed change as a result of changing the type of retainer ring. However, the process of the present invention would still work perfectly well if we elected to change the polishing pad rather than the retainer ring.

Typically each layer that is subjected to CMP is between about 1.5 and 4 microns thick. In TABLE II we summarize the preferred operating conditions (pad pressure and pad rotation speed) for the various combinations of pad and retainer ring type seen in TABLE I:

TABLE II

| Pad type →<br>Retaining<br>ring type ↓ | HARD | SOFT |
|---|---|---|
| STANDARD | between 2 and 8 PSI<br>between 10 and 150 RPM | between 2 and 8 PSI<br>between 10 and 150 RPM |
| SLOTTED | between 2 and 8 PSI<br>between 10 and 150 RPM | between 2 and 8 PSI<br>between 10 and 150 RPM |

Retaining pressure was 4–6.5 PSI; membrane pressure was 3–6 PSI; head rotation was 60–120 RPM; and pad rotation was 30–110 RPM.

What is claimed is:

1. A process for chemical mechanical polishing of a semiconductor wafer whose upper surface has a central region and a peripheral region, comprising:
   providing a first chemical mechanical polishing apparatus that further comprises a first retaining ring and a first polishing pad, whereby, after polishing with said first apparatus, said peripheral region differs in height from said central region by a first amount;
   providing a second chemical mechanical polishing apparatus that further comprises a second retaining ring and a second polishing pad, whereby, after polishing with said second apparatus, said peripheral region differs in height from said central region by a second amount whose direction, relative to said upper surface, is opposite to that of said first amount;
   depositing a plurality of layers onto said wafer; and
   planarizing each layer prior to the deposition of the next layer using one of said chemical mechanical apparatuses.

2. The process described in claim 1 wherein no two contiguous layers are planarized using the same apparatus.

3. The process described in claim 1 wherein each deposited layer has a thickness between about 1.5 and 4 microns.

4. The process described in claim 1 wherein at least one of said deposited layers further comprises polysilicon embedded in a dielectric material.

5. The process described in claim 1 wherein at least one of said deposited layers further comprises metal embedded in a dielectric material.

6. The process described in claim 1 wherein an odd number of layers is planarized, including a final layer, and said final layer is planarized by using, in sequence, both of said first and second apparatuses.

7. The process described in claim 1 wherein said first amount of height difference is between about 1,000 and 2,000 Angstroms.

8. The process described in claim 1 wherein said second amount of height difference is between about 1,000 and 2,000 Angstroms.

9. A process for chemical mechanical polishing of a semiconductor wafer whose upper surface has a central region and a peripheral region, comprising:
   providing a first chemical mechanical polishing apparatus that further comprises a standard retaining ring, a first membrane supporting said wafer, and a hard polishing pad, whereby, after polishing with said first apparatus, said peripheral region is between about 1,000 and 2,000 Angstroms below said central region;
   providing a second chemical mechanical polishing apparatus that further comprises a slotted retaining ring, a second membrane supporting said wafer, and a hard polishing pad, whereby, after polishing with said second apparatus, said peripheral region is between about 1,000 and 2,000 Angstroms above said central region;
   depositing a plurality of layers onto said wafer; and
   planarizing each layer prior to the deposition of the next layer, using one of said chemical mechanical apparatuses, whereby no two contiguous layers are planarized using the same apparatus.

10. The process described in claim 9 wherein an even number of layers is planarized.

11. The process described in claim 9 wherein each deposited layer has a thickness between about 1.5 and 4 microns.

12. The process described in claim 9 wherein at least one of said deposited layers further comprises polysilicon embedded in a dielectric material.

13. The process described in claim 9 wherein at least one of said deposited layers further comprises metal embedded in a dielectric material.

14. The process described in claim 9 wherein an odd number of layers is planarized, including a final layer, and said final layer is planarized by using, in sequence, both of said first and second apparatuses.

15. The process described in claim 9 wherein a pressure of between about 3 and 6 PSI is used when operating with said first membrane.

16. The process described in claim 9 wherein a pad pressure of between about 3 and 6 PSI is used when operating with said second membrane.

17. The process described in claim 9 wherein a pad rotation speed of between about 30 and 110 RPM is used when operating said first apparatus.

18. The process described in claim 9 wherein a pad rotation speed of between about 30 and 110 RPM is used when operating said second apparatus.

19. A process for chemical mechanical polishing of a semiconductor wafer whose upper surface has a central region and a peripheral region, comprising:
   providing a first chemical mechanical polishing apparatus that further comprises a standard retaining ring, a first membrane supporting said wafer, and a soft polishing pad, whereby, after polishing with said first apparatus, said peripheral region is between about 1,000 and 2,000 Angstroms above said central region;

providing a second chemical mechanical polishing apparatus that further comprises a slotted retaining ring, a second membrane supporting said wafer, and a soft polishing pad, whereby, after polishing with said second apparatus, said peripheral region is between about 1,000 and 2,000 Angstroms below said central region;

depositing a plurality of layers onto said wafer; and planarizing each layer prior to the deposition of the next layer, using one of said chemical mechanical apparatuses, whereby no two contiguous layers are planarized using the same apparatus.

20. The process described in claim 19 wherein an even number of layers is planarized.

21. The process described in claim 19 wherein each deposited layer has a thickness between about 1.5 and 4 microns.

22. The process described in claim 19 wherein at least one of said deposited layers further comprises polysilicon embedded in a dielectric material.

23. The process described in claim 19 wherein at least one of said deposited layers further comprises metal embedded in a dielectric material.

24. The process described in claim 19 wherein an odd number of layers is planarized, including a final layer, and said final layer is planarized by using, in sequence, both of said first and second apparatuses.

25. The process described in claim 19 wherein a pressure of between about 3 and 6 PSI is used when operating with said first membrane.

26. The process described in claim 19 wherein a pressure of between about 3 and 6 PSI is used when operating with said second membrane.

27. The process described in claim 19 wherein a pad rotation speed of between about 30 and 110 RPM is used when operating said first apparatus.

28. The process described in claim 19 wherein a pad rotation speed of between about 30 and 110 RPM is used when operating said second apparatus.

29. A process for chemical mechanical polishing of a semiconductor wafer whose upper surface has a central region and a peripheral region, comprising:

providing a first chemical mechanical polishing apparatus that further comprises a standard retaining ring and a first polishing pad, whereby, after polishing with said first apparatus, said peripheral region is between about 1,000 and 2,000 Angstroms below said central region;

providing a second chemical mechanical polishing apparatus that further comprises a standard retaining ring and a second polishing pad that is softer than said first polishing pad, whereby, after polishing with said second apparatus, said peripheral region is between about 200 and 2,000 Angstroms above said central region;

depositing a plurality of layers onto said wafer; and planarizing each layer prior to the deposition of the next layer, using one of said chemical mechanical apparatuses, whereby no two contiguous layers are planarized using the same apparatus.

30. The process described in claim 29 wherein an even number of layers is planarized.

31. The process described in claim 29 wherein an odd number of layers is planarized, including a final layer, and said final layer is planarized by using, in sequence, both of said first and second apparatuses.

32. A process for chemical mechanical polishing of a semiconductor wafer whose upper surface has a central region and a peripheral region, comprising:

providing a first chemical mechanical polishing apparatus that further comprises a slotted retaining ring and a first polishing pad, whereby, after polishing with said first apparatus, said peripheral region is between about 1,000 and 2,000 Angstroms above said central region;

providing a second chemical mechanical polishing apparatus that further comprises a slotted retaining ring and a second polishing pad that is softer than said first polishing pad, whereby, after polishing with said second apparatus, said peripheral region is between about 1,000 and 2,000 Angstroms below said central region;

depositing a plurality of layers onto said wafer; and planarizing each layer prior to the deposition of the next layer, using one of said chemical mechanical apparatuses, whereby no two contiguous layers are planarized using the same apparatus.

33. The process described in claim 32 wherein an even number of layers is planarized.

34. The process described in claim 32 wherein an odd number of layers is planarized, including a final layer, and said final layer is planarized by using, in sequence, both of said first and second apparatuses.

* * * * *